(12) United States Patent
Nishihagi

(10) Patent No.: US 8,723,520 B2
(45) Date of Patent: May 13, 2014

(54) METHOD OF CONTROLLING STATIC MAGNETIC FIELD IN NMR SPECTROMETER

(75) Inventor: Naoki Nishihagi, Tokyo (JP)

(73) Assignee: JEOL Resonance Inc., Tokyo (JP)

( * ) Notice: Subject to any disclaimer, the term of this patent is extended or adjusted under 35 U.S.C. 154(b) by 454 days.

(21) Appl. No.: 13/271,380

(22) Filed: Oct. 12, 2011

(65) Prior Publication Data

US 2012/0105062 A1    May 3, 2012

(30) Foreign Application Priority Data

Nov. 2, 2010  (JP) ................................. 2010-246164

(51) Int. Cl.
*G01V 3/00*    (2006.01)

(52) U.S. Cl.
USPC .......................................... 324/309; 324/315

(58) Field of Classification Search
USPC ........................... 324/300–322; 600/409–445
See application file for complete search history.

(56) References Cited

U.S. PATENT DOCUMENTS

| | | | |
|---|---|---|---|
| 6,696,040 B2* | 2/2004 | Driehuys | 424/9.3 |
| 6,791,326 B2* | 9/2004 | Gerald et al. | 324/318 |
| 7,357,917 B2* | 4/2008 | Driehuys | 424/9.3 |
| 2003/0117141 A1* | 6/2003 | Gerald et al. | 324/322 |

FOREIGN PATENT DOCUMENTS

JP    2002168932 A    6/2002

OTHER PUBLICATIONS

H. Barjat et al., "A Practical Method for Automated Shimming with Normal Spectrometer Hardware", Journal of Magnetic Resonance, (1997), pp. 197-201, 125.

* cited by examiner

*Primary Examiner* — Brij Shrivastav
(74) *Attorney, Agent, or Firm* — The Webb Law Firm

(57) ABSTRACT

A method of controlling the static magnetic field in an NMR spectrometer in such a way that the magnetic field can be homogenized even if there is a temperature gradient across a sample tube. A distribution of resonance frequencies and chemical shift differences within the sample tube is found by NMR measurements for each of two peaks of a calibration sample. A temperature distribution is found based on the distribution of the chemical shift differences. A distribution of chemical shifts of a solvent used for the measurements is found, based on the temperature distribution in the sample tube. Shimming is done using magnetic field gradients based on the distribution of the chemical shifts of the solvent.

10 Claims, 9 Drawing Sheets

METHOD OF CONTROLLING STATIC MAGNETIC FIELD IN NMR SPECTROMETER

BACKGROUND OF THE INVENTION

1. Field of the Invention

The present invention relates to a method of controlling a static magnetic field in an NMR spectrometer in such a way that the temperature inside a sample tube can be controlled.

2. Description of Related Art

From the past, field gradient shimming has been known as a technique for improving magnetic field homogeneity in an NMR sample space by the use of magnetic field gradients (see, for example, J. Magn. Reson. 125, 197-201 (1997), A Practical Method for Automated Shimming with Normal Spectrometer Hardware, H. Barjat, P. B. Chilvers, B. K. Fetler, T. J. Horne, and G. A. Morris). In this method, magnetic field gradients are applied, and the resulting NMR signal is measured. Shim values for homogenizing the static magnetic field are calculated from the obtained intensity distribution of the static magnetic field.

A known technique consisting of blowing heated gas upward from the bottom side of a sample tube is available as a method of controlling the temperature of a sample in an NMR spectrometer. If the sample temperature is controlled by this technique, the temperature at the bottom of the sample tube is close to the target temperature. The temperature becomes closer to the room temperature approaching the sample top. Therefore, a temperature gradient is created along the height of the sample tube. If gradient shimming is performed under this condition, it is impossible to achieve a uniform static magnetic field because the chemical shift varies from position to position within the sample tube due to the temperature gradient. Especially, when gradient shimming is performed on a solvent having a chemical shift with large temperature dependence, a nonuniform static magnetic field is produced by the influence of the temperature gradient. Examples of solvent having a chemical shift with large temperature dependence include water, methanol, ethanol, isopropanol, DMF (N,N-dimethyl formaldehyde), and their deuterated solvents.

One method of solving this problem is to reduce the temperature gradient across the sample tube (see, for example, JP-A-2002-168932). However, it is difficult to make uniform the temperature across the sample tube while avoiding deterioration of other performance characteristics. Another method is to replace the solvent by a solvent having a chemical shift with less temperature dependence. If different solvents are used, it is difficult to directly compare different sets of data. Furthermore, where the observed subject is insoluble, this method cannot be used. A further method is to perform a measurement at a controlled high temperature after performing shimming at room temperature. However, variations in the magnetic field caused by temperature variations cannot be canceled out.

SUMMARY OF THE INVENTION

In view of the foregoing problems, the present invention has been made. According to some aspects of the invention, a method is offered which controls the static magnetic field in an NMR spectrometer in such a manner that the magnetic field is made uniform even in a case where there is a temperature gradient across a sample tube.

(1) The present invention provides a method of controlling a static magnetic field in an NMR spectrometer in such a way that the temperature inside a sample tube can be controlled. The method starts with setting the temperature inside the sample tube to a given temperature. A distribution of resonance frequencies within the sample tube is found by NMR measurements for each of two peaks existing in an NMR spectrum of a calibration sample. A distribution of chemical shift differences within the sample tube is found for the two peaks, based on the difference in resonant frequency distribution between the two peaks. A temperature distribution across the sample tube at the set temperature is found based on the distribution of the chemical shift differences for the two peaks. A distribution of chemical shifts within the sample tube at the set temperature of a solvent used for the measurements is found, based on the temperature distribution across the sample tube at the set temperature. Shimming is done using magnetic field gradients based on the distribution of the chemical shifts of the solvent.

According to the present invention, a uniform static magnetic field can be accomplished even in a case where a temperature gradient exists across a sample tube.

(2) In the method of controlling a static magnetic field in an NMR spectrometer in accordance with the present invention, the calibration sample is a sample producing two peaks with chemical shifts which vary at different rates with varying temperature.

DESCRIPTION OF THE PREFERRED EMBODIMENTS

The preferred embodiments of the present invention are hereinafter described in detail with reference to the drawings.

1. Configuration

Figure 1:
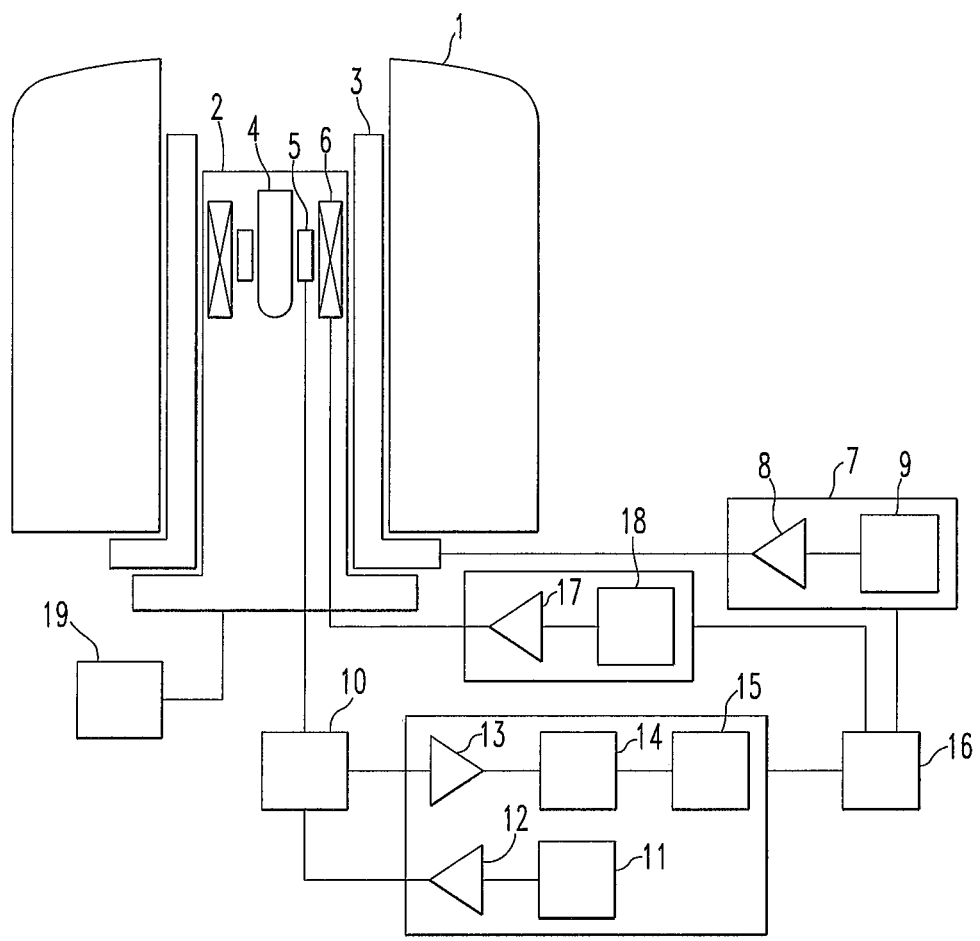
FIG. 1 is a schematic diagram showing the configuration of an NMR spectrometer associated with an embodiment of the present invention.

FIG. 1 is a diagram schematically showing the configuration of a nuclear magnetic resonance (NMR) spectrometer associated with an embodiment of the present invention.

The spectrometer has a superonconducting magnet 1 provided with a vertical bore along the center axis of the magnet. A shim coil set (shim coil assembly) 3 is mounted in the vertical bore to correct distortions in a static magnetic field produced by the superconducting magnet 1. The shim coil set 3 is under control of a shim controller unit 7 which includes a shim power supply 8 for supplying electric current to the shim coil set 3 and a shim control portion 9 for controlling the shim power supply 8.

An NMR probe 2 is mounted inside the shim coil set 3. A detection coil 5 and magnetic field gradient coils 6 are mounted inside the NMR probe 2 so as to surround a sample tube 4 holding a sample therein.

The detection coil 5 irradiates RF pulses at the sample and detects an NMR signal emanating from the sample. The RF pulses are generated by an oscillator 11, amplified by a power amplifier 12, and directed at the sample via both a duplexer 10 and the detection coil 5. The NMR signal detected by the detection coil 5 is amplified by a preamplifier 13 via the duplexer 10, converted into audio frequencies by a receiver 14, and further converted into a digital signal by an A/D converter 15. The digital signal is accepted into a computer 16, where the signal is Fourier-transformed, thus obtaining an NMR spectrum.

The magnetic field gradient coils 6 are coils for applying pulsed magnetic field gradients to the sample. Electric current is supplied to the magnetic field gradient coils 6 from a field gradient power supply 17, which in turn is controlled by a field control portion 18. A spatial distribution of the intensities of the static magnetic field can be obtained by measuring the NMR signal while applying the magnetic field gradients by the magnetic field gradient coils 6. Shim values for homogenizing the static magnetic field can be obtained from the spatial distribution of the intensities of the static magnetic field.

A temperature control portion 19 controls the current flowing through a heater (not shown) mounted in the NMR probe 2 based on values measured by temperature sensors (not shown) mounted in the probe 2 to thereby control the temperature of an inert gas or other fluid flowing around the sample tube 4. Thus, the temperature of the sample tube 4 is variably controlled via the fluid. The fluid heated by the heater passes through a passageway formed inside the NMR probe 2 and is blown against the sample tube 4. As a result, the sample tube 4 is heated to a high temperature. Since the heated fluid is blown upwardly from the bottom side of the sample tube 4, the temperature of the bottom of the sample tube 4 is highest. The temperature decreases with going upward along the sample tube 4. A temperature gradient is created along the height of the sample tube 4.

2. Technique of the Present Embodiment

One example of the procedure of the method of controlling the static magnetic field in the NMR spectrometer in accordance with the present embodiment is described with reference to the flowchart of FIGS. 2A and 2B.

First, the sample tube 4 containing a calibration sample is inserted into the NMR probe 2 (step S1).

Then, the temperature control portion 19 controls and sets the temperature inside the sample tube 4 to a given temperature t (step S10).

Then, for each of two peaks existing in an NMR spectrum of the calibration sample, a heightwise distribution of resonant frequencies within the sample tube 4 (resonant frequency map) is found by NMR measurements (steps S12 and S14). A sample producing two peaks having chemical shifts which are varied at greatly different rates with varying temperature, such as ethylene glycol, methanol, and mixture of acetonitrile and water, is preferably used as the calibration sample.

In the present embodiment, ethylene glycol is used as the calibration sample. A resonant frequency map is acquired for each of hydroxyl group (OH group) (peak A) having a chemical shift with large temperature dependence and methylene group ($CH_2$ group) (peak B) having a chemical shift with small temperature dependence.

Figure 3A:
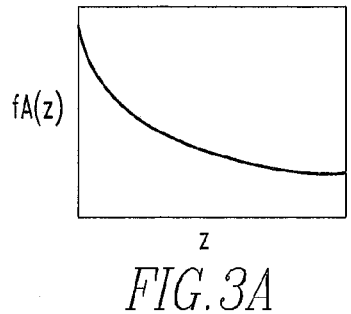
FIGS. 3A and 3B show resonant frequency maps of a calibration sample.
Figure 3B:
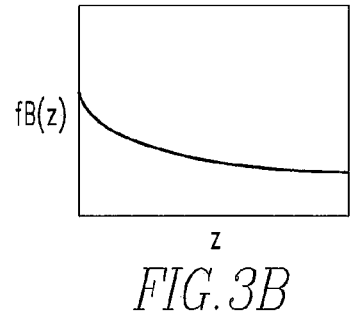

FIG. 3A shows a resonant frequency map $f_A(z)$ obtained regarding the peak A. FIG. 3B shows a resonant frequency map $f_B(z)$ obtained regarding the peak B. In both FIGS. 3A and 3B, the horizontal axis indicates the heightwise position z along the sample tube 4. As shown in FIG. 3A, with respect to the peak A having the chemical shift with large temperature dependence, the resonant frequency varies greatly from position to position due to the temperature gradient across the sample tube 4. On the other hand, as shown in FIG. 3B, with respect to the peak B having the chemical shift with small temperature dependence, the resonant frequency varies less greatly from position to position.

Let $B_0$ be a target static magnetic field. Let $\Delta B(z)$ be a distribution of distortions in the static magnetic field. Let $\sigma_A(z)$ be a distribution of chemical shifts of the peak A due to temperature. A resonant frequency map $f_A(z)$ regarding the peak A can be represented by $$f_A(z) = \gamma/2\pi^* B_0(1 + \Delta B(z)/B_0)(1 + \sigma_A(z)) \qquad (1)$$
$$= \gamma/2\pi^* B_0(1 + \Delta B(z)/B_0 + \sigma_A(z))$$

where $\gamma$ is the gyromagnetic ratio. Since the values of $\Delta B(z)/B_0$ and of $\sigma_A(z)$ are normally less than $10^{-8}$, the term of $\Delta B(z)/B_0 * \sigma_A(z)$ is neglected in Eq. (1).

Similarly, let $\sigma_B(z)$ be a distribution of chemical shifts regarding the peak B. A resonant frequency map $f_B(z)$ regarding the peak B can be represented by $$f_B(z) = \gamma/2\pi^* B_0(1 + \Delta B(z)/B_0)(1 + \sigma_B(z)) \qquad (2)$$
$$= \gamma/2\pi^* B_0(1 + \Delta B(z)/B_0 + \sigma_B(z))$$

Then, the difference between the resonant frequency maps $f_A(z)$ and $f_B(z)$ of the peaks A and B is calculated. A map of the chemical shift differences between the peaks A and B (a distribution of chemical shift differences inside the sample tube 4) is found (step S16 in FIG. 2A).

From Eqs. (1) and (2), the difference $\Delta f(z)$ between the resonant frequency maps of the peaks A and B can be represented by $$\Delta f(z) = f_A(z) - f_B(z) \qquad (3)$$
$$= \gamma/2\pi^* B_0(\sigma_A(z) - \sigma_B(z))$$
$$= \gamma/2\pi^* B_0(\Delta\sigma_{AB}(z))$$

Figure 3C:
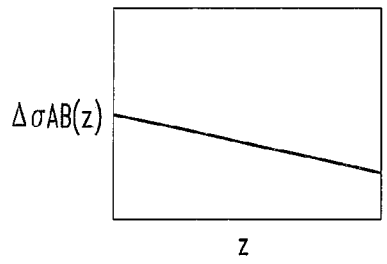
FIG. 3C shows a map of chemical shift differences of the calibration sample.

Accordingly, a map $\Delta\sigma_{AB}(z)$ of the chemical shift differences between the peaks A and B as shown in FIG. 3C can be found by calculating the difference $\Delta f(z)$ between the resonant frequency maps $f_A(z)$ and $f_B(z)$ of the peaks A and B and substituting the difference into Eq. (3).

Figure 2A:
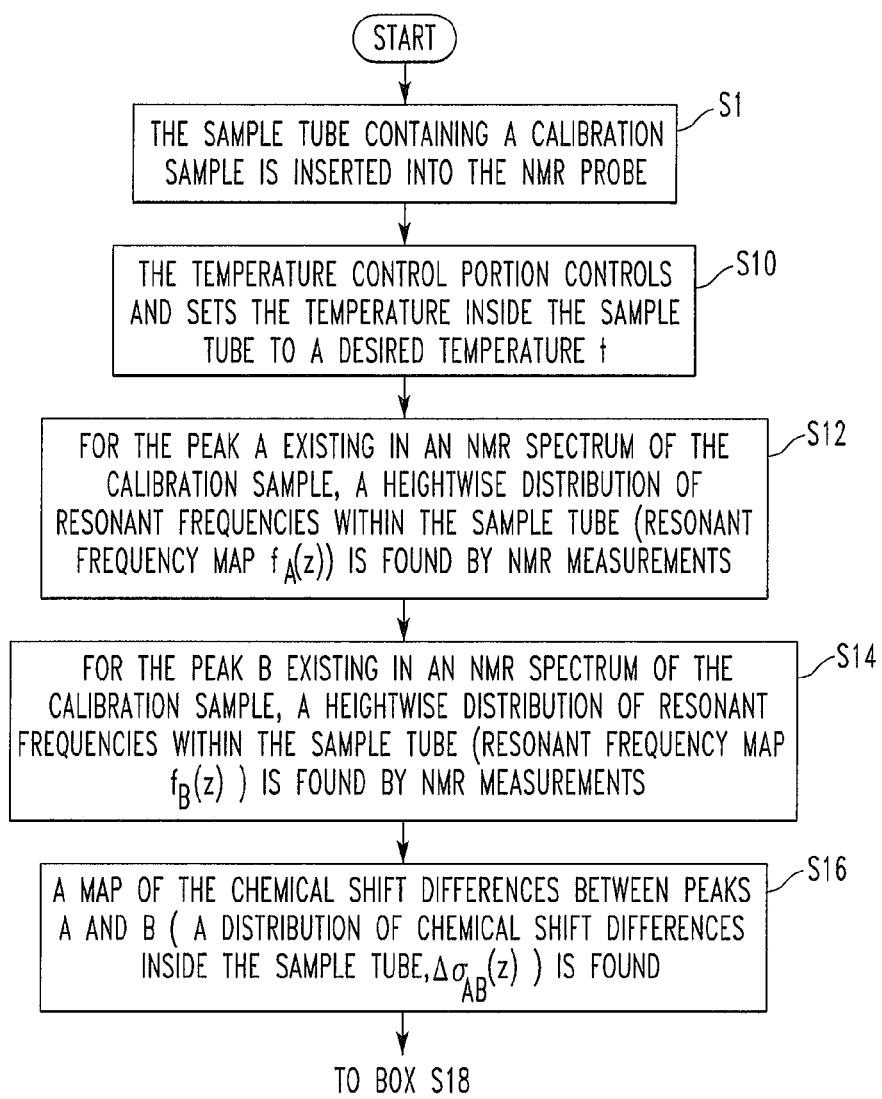
FIGS. 2A and 2B are flowcharts illustrating one example of procedure of the method of controlling a static magnetic field in an NMR spectrometer in accordance with an embodiment of the invention.
Figure 2B:
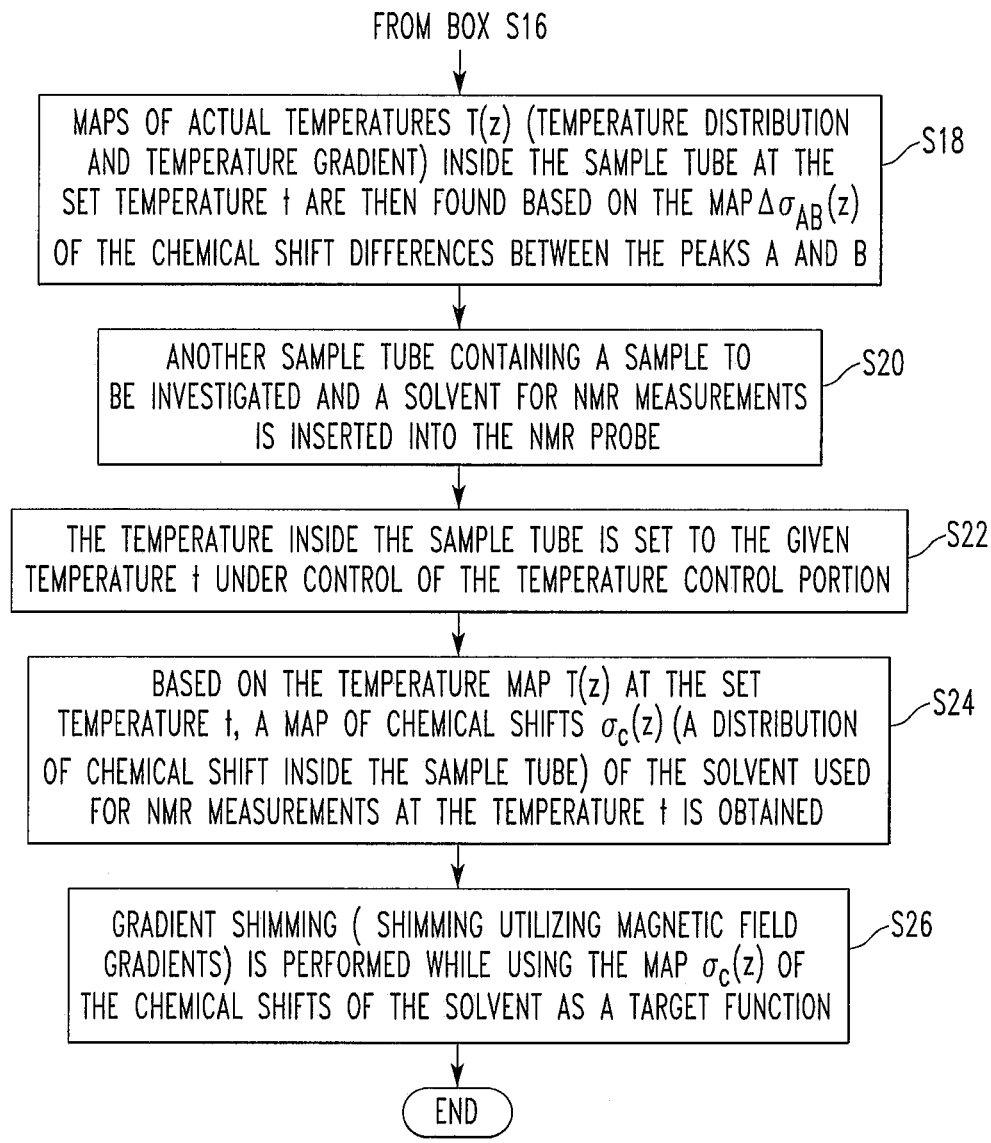
Figure 3D:
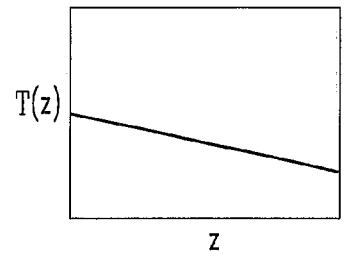
FIG. 3D shows a temperature map.

Maps of actual temperatures (temperature distribution and temperature gradient) inside the sample tube 4 at the temperature t set in step S10 are then found based on the map $\Delta\sigma_{AB}(z)$ of the chemical shift differences between the peaks A and B (step S18 of FIG. 2B). The relation of the chemical shift difference $\Delta\sigma_{AB}$ between the two peaks of the calibration sample to the temperature T can be represented by a known function T=F ($\Delta\sigma_{AB}$). Accordingly, a temperature map T(z) as shown in FIG. 3D can be found by substituting the map $\Delta\sigma_{AB}(z)$ of the chemical shift differences between the peaks A and B into the following formula:

$$T(z)=F(\Delta\sigma_{AB}(z)) \quad (4)$$

The relation of the chemical shift difference $\Delta\sigma_{AB}$ (in ppm) between OH group (peak A) and $CH_2$ group (peak B) of 100% concentration of ethylene glycol that is the calibration sample of the present embodiment to the temperature T (in K) can be given by $$T=466.5-102.00\Delta\sigma_{AB} \quad (5)$$

Maps of actual temperatures $T_1(z)$, $T_2(z)$, $T_3(z)$, and so on inside the sample tube 4 are obtained at each of plural different set temperatures $t_1$, $t_2$, $t_3$, and so on by repeating the procedure of steps S10-S18 of FIGS. 2A and 2B while varying the set temperature in this way.

Then, the sample tube 4 containing the calibration sample is taken out of the NMR probe 2. Another sample tube 4 containing a sample to be investigated and a solvent for NMR measurements is inserted into the NMR probe 2 (step S20). The temperature inside the sample tube 4 is set to the desired temperature t under control of the temperature control portion 19 (step S22).

Figure 4A:
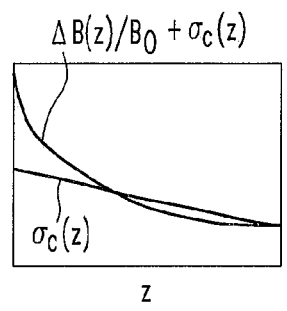
FIGS. 4A and 4B are maps of chemical shifts of solvents.

Then, based on the temperature map T(z) at the set temperature t, a map of chemical shifts (a distribution of chemical shifts inside the sample tube 4) of the solvent used for NMR measurements at the set temperature t is obtained (step S24). The relation between the chemical shift $\sigma_C$ of the solvent and the temperature T can be represented by a known function $T=F(\sigma_C)$. Accordingly, a map $\sigma_C(z)$ of chemical shifts of the solvent as shown in FIG. 4A can be created by substituting the temperature map T(z) at the set temperature t into the following formula:

$$T(z)=F(\sigma_C(z)) \quad (6)$$

In the present embodiment, since deuterated water ($D_2O$) is used as the solvent for NMR measurements, a map of chemical shifts of deuterium nuclei ($^2H$) at the set temperature t is created.

Figure 4B:
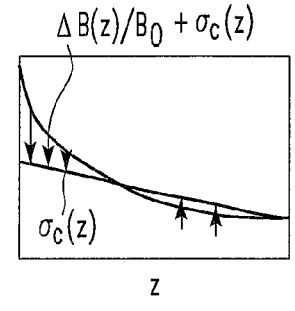
Figure 4C:
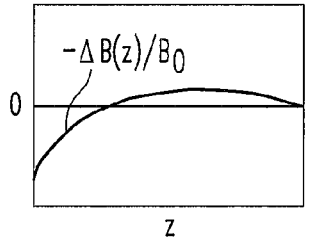
FIG. 4C is a diagram showing shim values.

Then, gradient shimming (shimming utilizing magnetic field gradients) is performed while using the map $\sigma_C(z)$ of the chemical shifts of the solvent as a target function (step S26 of FIG. 2B). In particular, as shown in FIG. 4B, gradient shimming is done in such a way that a resonant frequency map (a function of $\Delta B(z)/B_0+\sigma_C(z)$) of the solvent agrees with the map $\sigma_C(z)$ of the chemical shifts of the solvent that is the target function. Consequently, shim values which cancel out only the term of distortions of the static magnetic field ($\Delta B(z)/B_0$) can be found. The static magnetic field can be homogenized using the found shim values ($-\Delta B(z)/B_0$) (see FIG. 4C).

As described so far, in the present embodiment, a map of temperatures (temperature gradient) across a sample tube is previously obtained using plural set temperatures. A distribution of chemical shifts of the solvent is found from the temperature gradient at the set temperatures. Using the distribution of the chemical shifts as a target function, a shimming operation that corrects only the distortion of the static magnetic field is performed, thus adjusting the static magnetic field. In consequence, even in a case where an NMR measurement is performed using deuterated solvent having a chemical shift with large temperature dependence, a shimming operation that homogenizes the static magnetic field while maintaining the high temperature can be carried out.

3. Results of Measurements

Figure 5A:
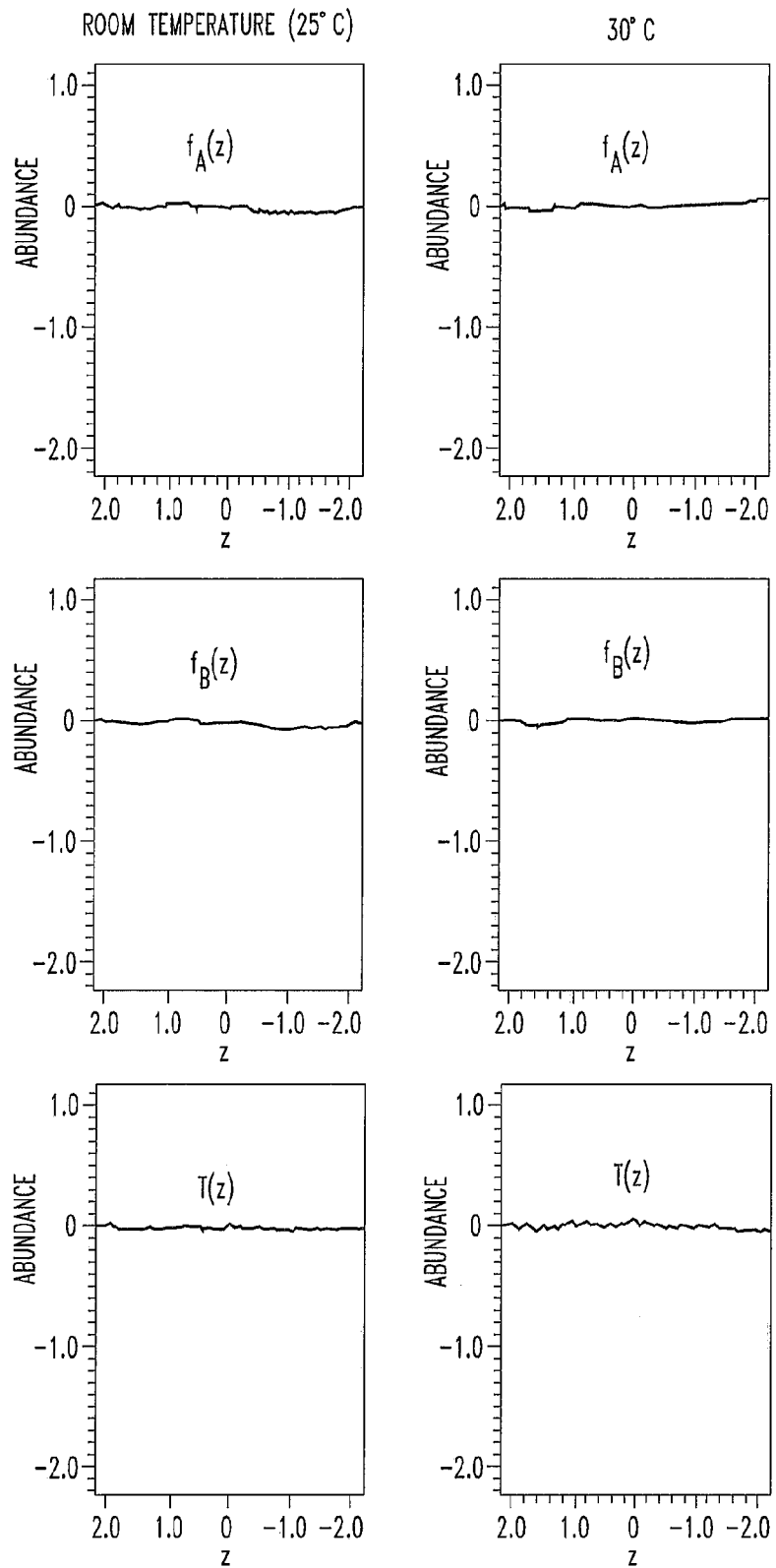
FIGS. 5A and 5B show resonant frequency maps and temperature maps.
Figure 5B:
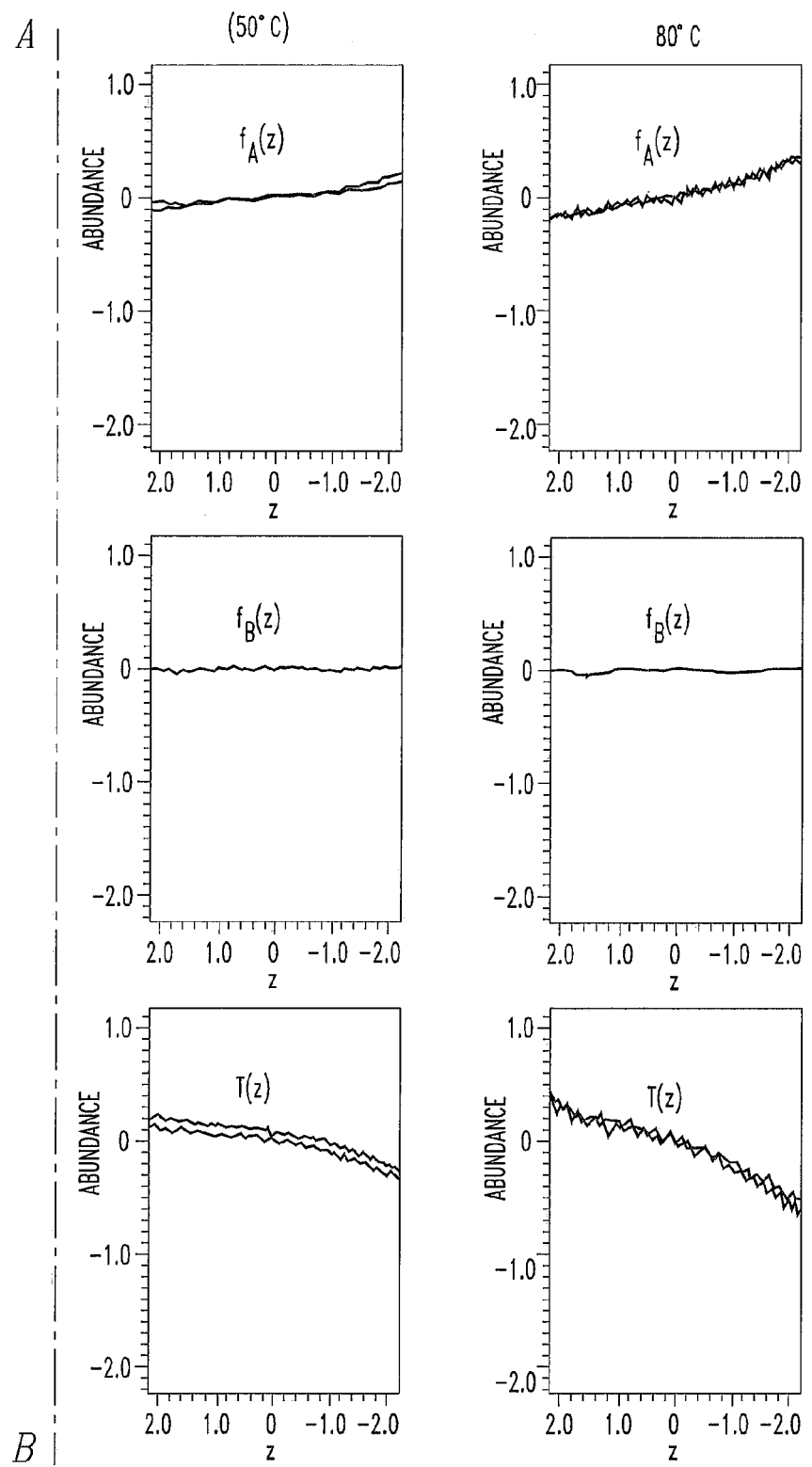

Resonant frequency maps and temperature maps were created using ethylene glycol as a calibration sample while varying the set temperature at room temperature (25° C.), at 30° C., at 50° C., and at 80° C. A resonant frequency map $f_A(z)$ of the peak A (hydrogen nucleus ($^1H$) of OH group of the ethylene glycol), a resonant frequency map $f_B(z)$ of the peak B (hydrogen nucleus ($^1H$) of $CH_2$ group of the ethylene glycol), and a temperature map T(z) found from the resonant frequency maps are shown in FIGS. 5A and 5B. In each chart of FIGS. 5A and 5B, the horizontal axis indicates heightwise positions. The left side indicates the top position of the coil set. The right side indicates the bottom position of the coil set. In each temperature map T(z), the vertical axis indicates temperatures. The temperature goes down with going upward along the vertical axis, and vise versa.

As shown in FIG. 5A, at room temperature, no temperature gradient was created and, therefore, the resonant frequency of each peak was constant irrespective of position. As the set temperature rose, the temperature gradient became steeper. Because of this influence, the resonant frequency varied greatly from position to position especially for the peak A having a chemical shift with large temperature dependence.

Figure 6A:
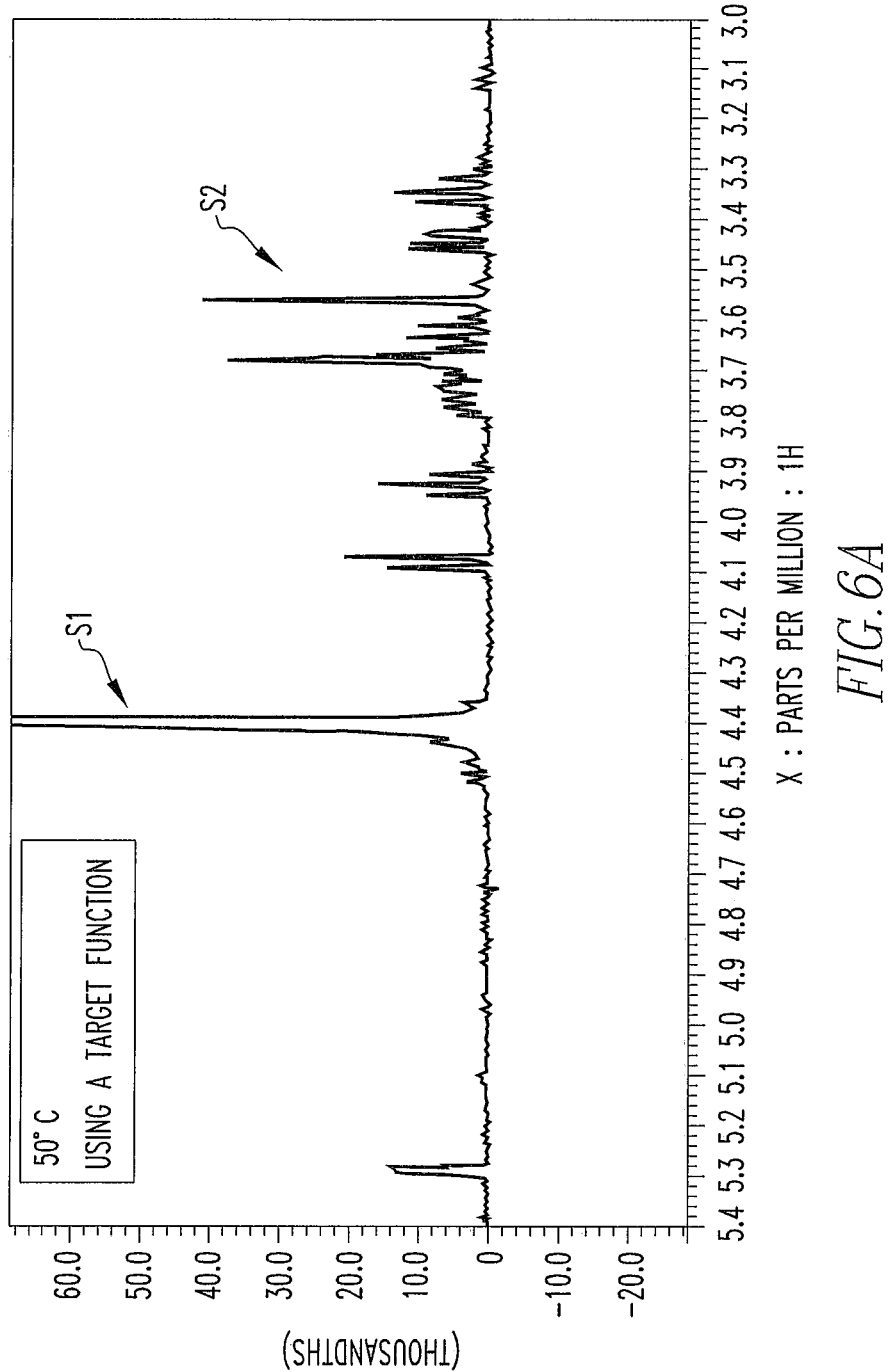
FIGS. 6A, 6B, and 6C show NMR spectra.
Figure 6B:
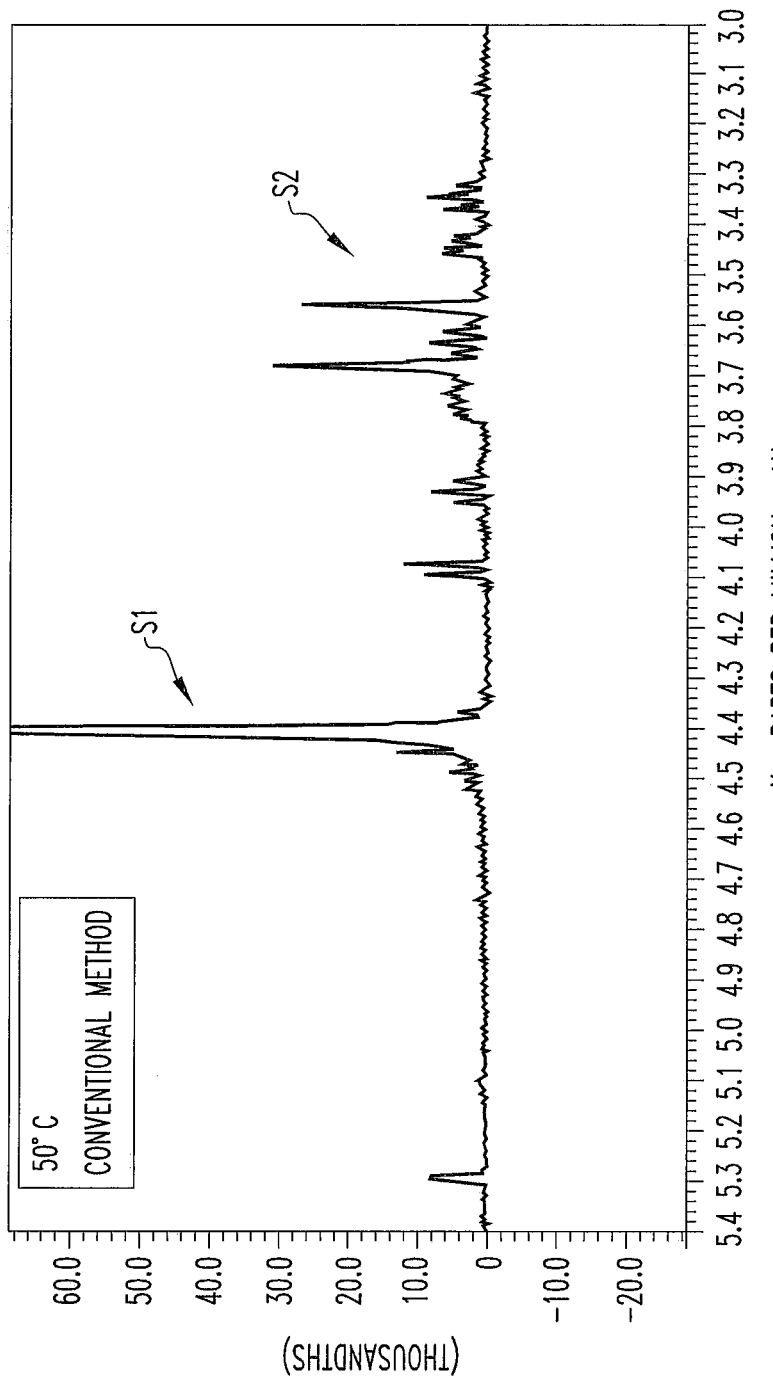
Figure 6C:
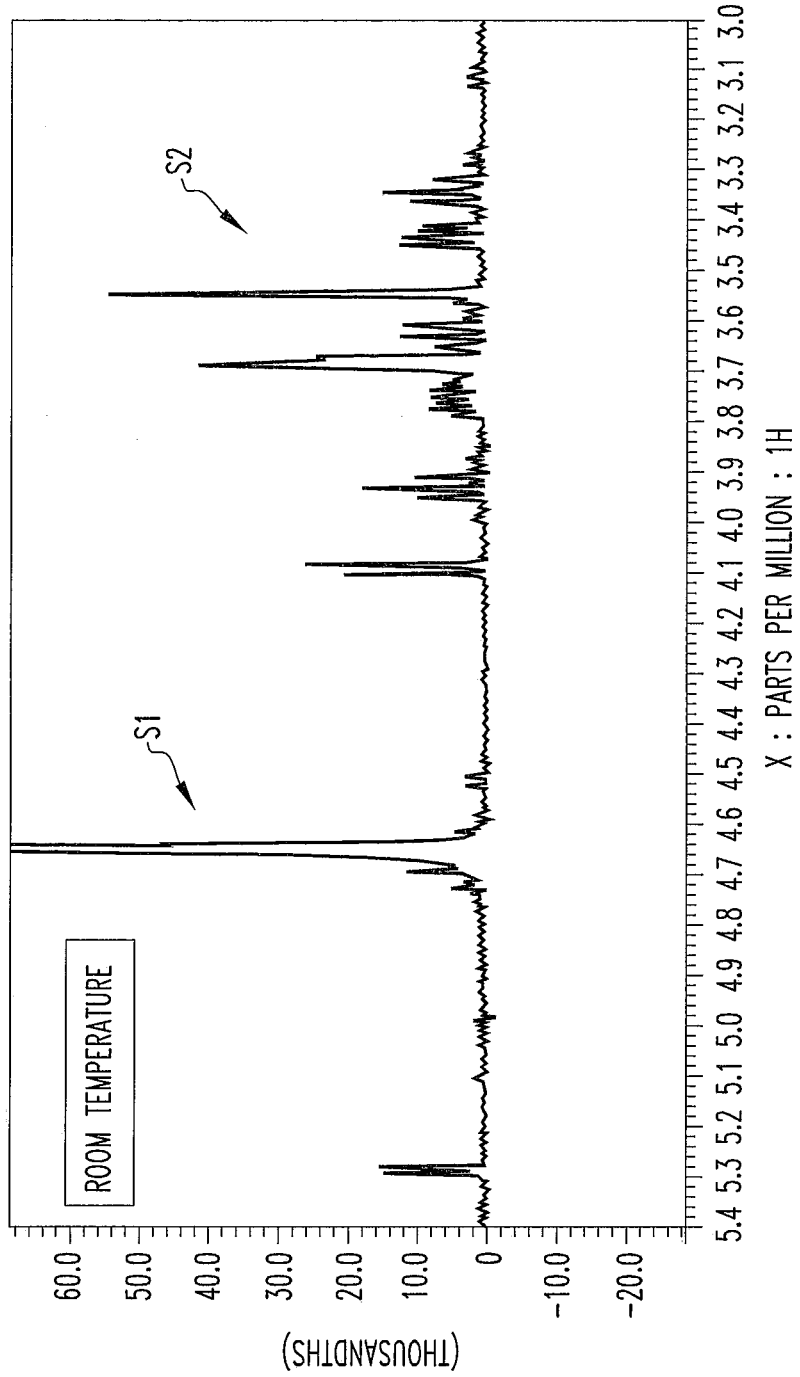

NMR spectra acquired while performing gradient shimming using $D_2O$ solvent are shown in FIGS. 6A-6C. FIG. 6A is an NMR spectrum derived when gradient shimming was done using a target function $\sigma_C(z)$ by the technique of the present embodiment at the set temperature of 50° C. FIG. 6B is an NMR spectrum obtained when gradient shimming was performed by the conventional method at the set temperature of 50° C. FIG. 6C is an NMR spectrum obtained when gradient shimming was carried out at room temperature.

As shown in FIG. 6C, in a case where gradient shimming was done at room temperature, no temperature gradient was produced. The static magnetic field was made uniform by the gradient shimming. Consequently, peak S1 of $D_2O$ and peak S2 of the sample were both sharp signals.

As shown in FIG. 6B, in a case where gradient shimming was done at elevated temperatures by the conventional method, the peak S1 of $D_2O$ was a sharp signal but the peak S2 of the sample to be observed was a broader signal having a greater linewidth than in the case of room temperature of FIG. 6C for the following reason. Gradient shimming was done so as to homogenize the resonant frequency distribution of $D_2O$ under the condition where the distribution of chemical shifts of $D_2O$ was not uniform due to a temperature gradient across the sample tube. As a result, a nonuniform static magnetic field was produced. The peak S2 of the sample of a chemical shift with small temperature dependence was a broad signal.

On the other hand, in a case where gradient shimming was done at elevated temperatures by the technique of the present embodiment as shown in FIG. 6A, the peak S1 of $D_2O$ was a broad signal but the peak S2 of the sample to be observed was a sharp signal in the same way as in the case of room temperature of FIG. 6C, for the following reason. The gradient shimming was done while taking account of the effects of the chemical shifts due to temperature gradient of $D_2O$ using the distribution $\sigma_C(z)$ of the chemical shifts of $D_2O$ found from the temperature gradient T(z) as a target function. Consequently, a uniform static magnetic field was accomplished by correcting only the distortion of the static magnetic field.

Therefore, with respect to the signal of a sample having a chemical shift with small temperature dependence, a sharp spectrum can be obtained.

In this way, according to the technique of the present embodiment, even if there is a temperature gradient across a sample tube during temperature-variable measurements, a uniform static magnetic field can be accomplished using gradient shimming.

One example of chemical shift thermometer that can be used in the present invention is a combination of $^1$H nucleus of methylene group ($CH_2$) and $^1$H nucleus of hydroxyl group (OH) of the aforementioned ethylene glycol, both $^1$H nuclei being used as observed nuclei. Besides, various combinations of nuclear species of observed groups as listed in Table 1 are possible. A choice can be made according to the nuclear species to be investigated and according to the nature of the investigated sample.

Table 1: Compounds used in chemical shift thermometers, their observed nuclei, and observed groups (elements of observed groups printed in bold are nuclear species measured with chemical shift thermometers).

TABLE 1

| chemical shift thermometer | observed nucleus | observed group | observed group | compound name | |
|---|---|---|---|---|---|
| methanol | $^1$H | CH$_3$ | OH | methanol | |
| ethanol | $^1$H | CH$_3$ | OH | ethanol | |
| isopropanol | $^1$H | CH$_3$ | OH | 2-propanol | |
| ethylene glycol | $^1$H | CH$_2$ | OH | ethylene glycol | |
| acetonitrile + light water | $^1$H | CH$_3$ in $CH_3CN$ | OH in $H_2O$ | acetonitrile | water |
| heavy acetone + carbon tetrachloride | $^{13}$C | CO in $(CD_3)_2CO$ | $CCl_4$ | acetone-$d_6$ | carbon tetrachloride |

It is to be understood that the present invention is not restricted to the foregoing embodiments and that various changes and modifications are possible. The invention embraces configurations (e.g., configurations identical in function, method, and results or configurations identical in purpose and effects) substantially identical with the configurations described in the embodiments. Furthermore, the invention embraces configurations having those non-essential portions of the configurations described in the embodiment which have been replaced by other portions. In addition, the invention embraces configurations yielding the same advantageous effects or configurations capable of achieving the same purpose as the configurations described in the embodiments. Further, the invention embraces configurations consisting of the configurations described in the embodiments to which well-known techniques are attached.

Having thus described my invention with the detail and particularity required by the Patent Laws, what is desired protected by Letters Patent is set forth in the following claims.

The invention claimed is:

1. A method of controlling a static magnetic field in an NMR spectrometer in such a way that the temperature inside a sample tube can be controlled, said method comprising the steps of:
    setting the temperature inside the sample tube to a given temperature;
    finding a distribution of resonance frequencies within the sample tube by NMR measurements for each of two peaks existing in an NMR spectrum of a calibration sample;
    finding a distribution of chemical shift differences within the sample tube for the two peaks, based on a difference in resonant frequency distribution between the two peaks;
    finding a temperature distribution across the sample tube at the set temperature based on the distribution of the chemical shift differences for the two peaks;
    finding a distribution of chemical shifts within the sample tube at the set temperature of a solvent used for the measurements based on the temperature distribution across the sample tube at the set temperature; and
    doing shimming using magnetic field gradients based on the distribution of the chemical shifts of the solvent.

2. A method of controlling a static magnetic field in an NMR spectrometer as set forth in claim 1, wherein said solvent is a solvent having a chemical shift with great temperature dependence.

3. A method of controlling a static magnetic field in an NMR spectrometer as set forth in claim 2, wherein said solvent having a chemical shift with large temperature dependence is selected from the group consisting of water, methanol, ethanol, isopropanol, DMF (N,N-dimethyl formaldehyde), and deuterated solvents thereof.

4. A method of controlling a static magnetic field in an NMR spectrometer as set forth in claim 1, wherein said calibration sample is a sample producing two peaks having chemical shifts which vary at different rates with varying temperature.

5. A method of controlling a static magnetic field in an NMR spectrometer as set forth in claim 4, wherein the two peaks having chemical shifts which vary at different rates with varying temperature are $^1$H-NMR signals originating from $^1$H nucleus of methyl group of a methanol molecule and from $^1$H nucleus of hydroxyl group of a methanol molecule.

6. A method of controlling a static magnetic field in an NMR spectrometer as set forth in claim 4, wherein the two peaks having chemical shifts which vary at different rates with varying temperature are $^1$H-NMR signals originating from $^1$H nucleus of methyl group of an ethanol molecule and from $^1$H nucleus of hydroxyl group of an ethanol molecule.

7. A method of controlling a static magnetic field in an NMR spectrometer as set forth in claim 4, wherein the two peaks having chemical shifts which vary at different rates with varying temperature are $^1$H-NMR signals originating from $^1$H nucleus of methyl group of an isopropanol molecule and from $^1$H nucleus of hydroxyl group of an isopropanol molecule.

8. A method of controlling a static magnetic field in an NMR spectrometer as set forth in claim 4, wherein the two peaks having chemical shifts which vary at different rates with varying temperature are $^1$H NMR signals originating from $^1$H nucleus of methylene group of an ethylene glycol molecule and from $^1$H nucleus of hydroxyl group of an ethylene glycol molecule.

9. A method of controlling a static magnetic field in an NMR spectrometer as set forth in claim 4, wherein the two peaks having chemical shifts which vary at different rates with varying temperature are $^1$H-NMR signals originating from $^1$H nucleus of methyl group of an acetonitrile molecule and from $^1$H nucleus of hydroxyl group of a light water molecule.

10. A method of controlling a static magnetic field in an NMR spectrometer as set forth in claim 4, wherein the two peaks having chemical shifts which vary at different rates with varying temperature are $^{13}$C-NMR signals originating from $^{13}$C nucleus of ketone group of a deuterated acetone molecule and from $^{13}$C nucleus of a carbon tetrachloride molecule.

* * * * *